United States Patent [19]

Yamamoto et al.

[11] Patent Number: 5,025,449
[45] Date of Patent: Jun. 18, 1991

[54] OPTICAL PUMPING-TYPE SOLID-STATE LASER APPARATUS WITH A SEMICONDUCTOR LASER DEVICE

[75] Inventors: Osamu Yamamoto; Toshihiko Yoshida, both of Nara, Japan

[73] Assignee: Sharp Kabushiki Kaisha, Japan

[21] Appl. No.: 500,039

[22] Filed: Mar. 27, 1990

[30] Foreign Application Priority Data

Mar. 28, 1989 [JP] Japan ............................ 1-77824

[51] Int. Cl.$^5$ ............................................. H01S 3/133
[52] U.S. Cl. ........................................ 372/32; 372/29; 372/34
[58] Field of Search ...................... 372/29, 32, 34, 36, 372/71, 75

[56] References Cited

U.S. PATENT DOCUMENTS

| | | | |
|---|---|---|---|
| 4,309,671 | 1/1982 | Malyon | 372/32 |
| 4,450,565 | 5/1984 | Copeland | 372/32 |
| 4,719,631 | 1/1988 | Conaway | 372/34 |
| 4,829,533 | 5/1989 | Hallberg et al. | 372/29 |

OTHER PUBLICATIONS

Josef Berger et al., "High Power, High Efficient Neodymium;yttrium Aluminum Garnet Laser End Pumped by a Laser Diode Array", *Appl. Phys. Lett.* 51, 19 Oct. 1987, pp. 1212-1214.
Fields et al., "Highly Efficient Nd;YVO$_4$ Diode-Laser End-Pumped Laser," Appl. Phys. Lett. 51, 7 Dec. 1987, pp. 1885-1886.
Article from *Laser Focus/Electro-Optics*, May 1988, p. 28.

*Primary Examiner*—Frank Gonzalez
*Assistant Examiner*—Galen J. Hansen
*Attorney, Agent, or Firm*—Nixon & Vanderhye

[57] ABSTRACT

Disclosed is an optical pumping-type solid-state laser apparatus in which a semiconductor laser device is used as a light source for optical pumping. The solid-state laser apparatus includes first and second photodetectors. The former detects the amount of light emitted from the semiconductor laser device, and the latter detects the amount of laser light transmitted through a filter plate which has the same light-absorbance characteristics as that of the solid-state laser. In accordance with the detected results, a driving circuit drives the semiconductor laser device to obtain a laser beam with an appropriate output level and a temperature regulator regulates the temperature of the semiconductor laser device so that the wavelength of the laser light to be emitted therefrom is accurately adjusted to be the same as that of the light to be efficiently absorbed by the solid-state laser. The laser beam with the accurately adjusted wavelength is used for optically pumping the solid-state laser.

12 Claims, 3 Drawing Sheets

OPTICAL PUMPING-TYPE SOLID-STATE LASER APPARATUS WITH A SEMICONDUCTOR LASER DEVICE

BACKGROUND OF THE INVENTION

1. Field of the Invention

The present invention relates to an optical pumping-type solid-state laser apparatus with a semiconductor laser device, in which the solid-state laser is optically pumped by a laser beam with a predetermined wavelength emitted from the semiconductor laser device so as to generate a laser beam with a target wavelength.

2. Description

A conventional solid-state laser is optically pumped by light emitted from a flash lamp so as to generate a laser beam. In general, however, many solid-state lasers such as Nd-doped YAG lasers efficiently absorb light with only a short range of wavelengths. Since the light emitted from the flash lamp has a wide variety of wavelengths, only a small part of the light thereof is absorbed by the solid-state laser. Thus, this type of solid-state laser has low efficiency of conversion of light from the light source into a final laser beam.

On the other hand, laser light emitted from a semiconductor laser device has a similar range of wavelengths to that of the light efficiently absorbed by the solid-state laser mentioned above. Thus, the use of such a semiconductor laser device as a light source for optical pumping attains higher efficiency in the conversion of the light from the light source into a final laser beam. With the development of a more reliable semiconductor laser device of higher output power, an optical pumping-type solid-state laser apparatus which utilizes a semiconductor laser device as a light source for optically pumping the solid-state laser for the generation of a desired laser beam has been developed.

FIG. 5 shows a conventional optical pumping-type solid-state laser apparatus with a semiconductor laser device. The semiconductor laser device 61 is mounted on a temperature regulator 67, which modifies the wavelength of the laser light to be emitted from the semiconductor laser device 61. The laser beam emitted from the semiconductor laser device 61 is directed through a light-converging unit 62 onto a light-receiving facet 63a of a YAG rod 63. At the other side of the YAG rod 63 is disposed a reflecting mirror 64, facing a light-emitting facet 63b of the YAG rod 63. The light-receiving facet 63a of the YAG rod 63 and the reflecting mirror 64 constitute a laser resonator. The YAG rod 63 absorbs laser light emitted from the semiconductor laser device 61 and is optically pumped by the laser light so as to generate a laser beam with a wavelength of 1.064 μm.

FIG. 6A shows the light-absorption characteristics of the YAG rod 63 with respect to wavelengths of light. As shown in FIG. 6A, the YAG rod 63 absorbs light with a wavelength of 0.809 μm at high efficiency. Thus, the semiconductor laser device 61, which can emit a laser beam with the wavelength of 0.809 μm, is used for optically pumping the YAG rod 63.

The light-receiving facet 63a of the YAG rod 63 is coated with a film which transmits light with a wavelength of 0.809 μm and reflects light with a wavelength of 1.064 μm. On the other hand, the light-emitting facet 63b facing the reflecting mirror 64 is coated with a film which transmits light with the wavelength of 1.06 μm. The surface of the reflecting mirror 64 which faces the light-emitting facet 63b is coated with a reflecting film for reflecting light with the wavelength of 1.064 μm at a high reflectivity.

In such an optical pumping-type solid-state laser apparatus, the temperature regulator 67 regulates the temperature of the semiconductor laser device 61 so that the laser light to be emitted therefrom has the wavelength of 0.809 μm, which can be absorbed by the YAG rod 63 at high efficiency as described above. Thus, the laser beam emitted from the semiconductor laser device 61 is efficiently absorbed by the YAG rod 63, which is then optically pumped by the laser light to generate therein a laser beam with a wavelength of 1.064 μm. Then, the resultant laser beam is emitted therefrom at a high output level. An optical pumping-type solid-state laser apparatus with the above configuration has been developed as a small-sized laser light source for laser instrumentaion and measurement, laser material processing, and the like.

In the semiconductor laser device 61 used in such a conventional optical pumping-type solid-state laser apparatus, mode hopping or the like may arise due to deterioration with time, changes in temperature or in the level of the injected current, and the like. This changes the wavelength of the laser light emitted from the semiconductor laser device 61. Although a semiconductor laser device which can output a laser beam with a desired wavelength is carefully selected, the wavelength thereof tends to change for the above-mentioned reason, and accordingly deviates from the short range of wavelengths of light which can be absorbed at high efficiency by the YAG rod 63. This deviation changes the amount of the laser light to be absorbed by the YAG rod 63, thereby changing the resultant optical output power of the solid-state laser apparatus.

The laser generation efficiency of an Nd-doped YAG rod 63 with respect to the wavelengths of the laser light emitted from a semiconductor laser device 61 is shown in FIG. 6B. As shown in FIG. 6B, when the wavelength of the laser light deviates from the short range of wavelengths including 0.809 μm, the output level of the resultant laser beam is greatly decreased. As described above, the laser light of the semiconductor laser device used in the conventional optical pumping-type solid-state laser apparatus is likely to change in wavelength, which naturally decreases the output level of the resultant laser beam, thereby preventing the solid-state laser apparatus from generating laser light in a stable manner for a long period of time.

SUMMARY OF THE INVENTION

The optical pumping-type solid-state laser apparatus in accordance with the present invention, which overcomes the above-discussed and numerous other disadvantages and deficiencies of the prior art, comprises a semiconductor laser device; a solid-state laser which is optically pumped by laser light with a predetermined wavelength emitted from said semiconductor laser device so as to generate laser light with a target wavelength; a first optical detection means for detecting the amount of laser light emitted from said semiconductor laser device; a second optical detection means for detecting the amount of laser light which has been emitted from said semiconductor laser device and transmitted through a filter means, said filter means absorbing light with the same wavelength as that of light to be absorbed by said solid-state laser; and a means for modifying the wavelength of the laser light to be emitted from said semiconductor laser device in accordance with the detected results of said first and second optical detection means.

In a preferred embodiment, the means for modifying the wavelength of the laser light is a temperature regulator which regulates the temperature of said semiconductor laser device.

In a preferred embodiment, the second optical detection means includes a photodetector.

In a preferred embodiment, the second optical detection means may include two photodetectors for detecting the amount of laser light which has been emitted from said semiconductor laser device and transmitted through two respective filter means, said two filter means being arranged to first transmit laser light with two different ranges of wavelengths, respectively, and then absorb light with the same wavelength as that of the light to be absorbed by said solid-state laser, the central value of said two ranges of wavelengths being slightly shifted from each other.

In a preferred embodiment, the solid-state laser may receive laser beams emitted from a plurality of semiconductor laser devices.

In a preferred embodiment, the solid-state laser is a YAG laser.

Thus, the invention described herein makes possible the objective of providing an optical pumping-type solid-state laser apparatus utilizing a semiconductor laser device which emits a laser beam with an accurately adjusted wavelength for optically pumping the solid-state laser, thereby allowing the solid-state laser to stably generate a laser beam at a high output level for a long period of time.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
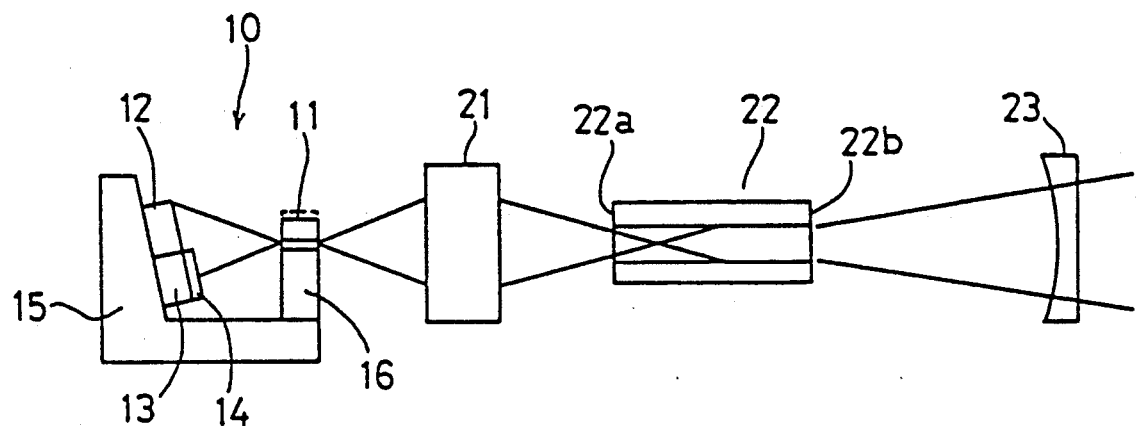
FIG. 1 is a schematic diagram showing an optical pumping-type solid-state laser apparatus with a semiconductor laser device in accordance with the invention.

FIG. 1 shows an optical pumping-type solid-state laser apparatus with a semiconductor laser device in accordance with the present invention, which comprises a semiconductor laser section 10, a light-converging unit 21, a YAG rod 22, and a reflecting mirror 23.

The semiconductor laser section 10 includes a semiconductor laser device 11 and a temperature regulator 16, which comprises a Peltier element, for adjusting the wavelength of the laser beam to be emitted from the semiconductor laser device 11, the semiconductor laser device 11 being mounted on the temperature regulator 16. The laser beam emitted from the semiconductor laser device 11 is converged by the light-converging unit 21 to be directed onto the light-receiving facet 22a of the YAG rod 22. At the other side of the YAG rod 22 is disposed the reflecting mirror 23 facing a light-emitting facet 22b of the YAG rod 22.

The light-receiving facet 22a of the YAG rod 22 is coated with a film which transmits light with a predetermined wavelength, for example, of 0.809 $\mu$m, i.e., the wavelength of light that can be absorbed by the YAG rod 22 at high efficiency. This film reflects the light to be generated in the YAG rod 22, i.e., the light with a target wavelength, for example, of 1.064 $\mu$m. The light-emitting facet 22b is also coated with a transmitting film which transmits a laser beam with the wavelength of 1.064 $\mu$m generated in the YAG rod 22. The surface of the reflecting mirror 23 is coated with a reflecting film which reflects the laser beam transmitted through the light-emitting facet 22b of the YAG rod 22, i.e., the laser beam with the wavelength of 1.064 $\mu$m.

With the above-described construction, the light-receiving facet 22a of the YAG rod 22 and the reflecting surface of the reflecting mirror 23 constitute a resonator. Since the YAG rod 22 absorbs light with the wavelength of 0.809 $\mu$m at high efficiency, it absorbs a large proportion of the laser beam emitted from the semiconductor laser device 11, the wavelength of which is carefully adjusted to 0.809 $\mu$m as will be described later in detail. This allows the YAG rod 22 to generate a final laser beam with the wavelength of 1.064 $\mu$m at a high output level.

The semiconductor laser section 10 also includes first and second photodetectors 12 and 13 consisting of pin photodiodes made of silicon, which are mounted on a supporting member 15 and located at the rear side of the semiconductor laser device 11, the rear side being opposite to the side provided with the light-converging unit 21. The first and second photodetectors 12 and 13 are disposed adjacent to each other or formed as a single unit. The semiconductor laser device 11 also emits a laser beam from its rear side toward the first and second photodetectors 12 and 13. The light-receiving surface of the second photodetector 13 is provided with a filter plate 14 which is made of the same laser material as that of the YAG rod 22. This means that the filter plate 14 absorbs the light with the same wavelength as that of the light absorbed by the YAG rod 22. The first photodetector 12 directly receives the light emitted from the semiconductor laser device 11, while the second photodetector 13 receives the light through the filter plate 14.

Figure 2:
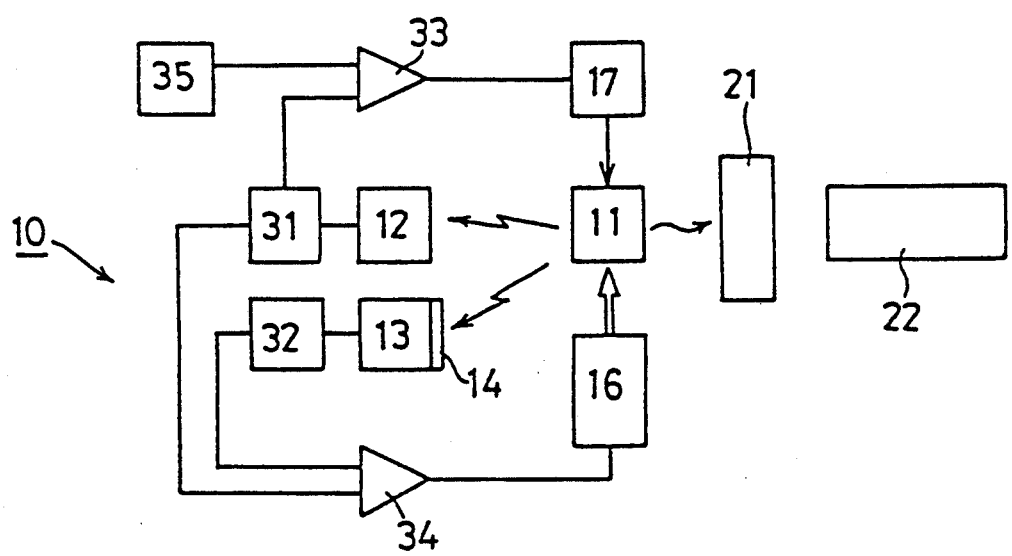
FIG. 2 is a block diagram showing the control system of the optical pumping-type solid-state laser apparatus of FIG. 1.

FIG. 2 is a block diagram showing a control system of the solid-state laser apparatus of FIG. 1. As described above, the laser beam emitted from the semiconductor laser device 11 is directed through the light-converging unit 21 into the YAG rod 22, allowing the YAG rod 22 to generate a laser beam with a target wavelength. At the same time, the semiconductor laser device 11 also emits light from its rear side toward the opposite direction, part of which is directly received by the first photodetector 12, and the other part of which is received by the second photodetector 13 through the filter plate 14. The first and second photodetectors 12 and 13 output electric signals in accordance with the amounts of light they have received. The output of the first photodetector 12 which has directly received the laser light is amplified by an amplifier 31 and supplied to one of the two input terminals of the first comparator 33 and also supplied to one of the two input terminals of the second comparator 34. The output of the second photodetector 13 which receives the laser light through the filter plate 14 is amplified by the amplifier 32 and supplied to the other input terminal of the second comparator 34. To the other input terminal of the first comparator 33, a standard signal generated by a standard signal generator 35 is supplied. The output of the first comparator 33 is fed to a driving circuit 17, which controls the semiconductor laser device 11 so that it generates a laser beam with a predetermined output level. The output of the second comparator 34 is supplied to the temperature regulator 16, which regulates the temperature of the semiconductor laser device 11 so as to adjust the wavelength of the laser light to be emitted therefrom.

The operation of the control system with the above-mentioned configuration will be described in more detail below.

As described above, the laser beam emitted from the rear side of the semiconductor laser device 11 is received by the first and second photodetectors 12 and 13. The first photodetector 12 directly receives the laser light and outputs a signal in accordance with the amount of light it has received. The signal is amplified by the amplifier 31 and then delivered to the first comparator 33, where it is compared with the standard signal generated by the standard signal generator 35. If it is determined that the amount of light detected by the first photodetector 12 is equal to or less than the standard level, the first comparator 33 outputs a predetermined signal to the driving circuit 17, which then drives the semiconductor laser device 11 to output laser light with a predetermined output level.

On the other hand, the second photodetector 13 receives the laser light through the filter plate 14 which absorbs the light with the same wavelength as that of the light absorbed by the YAG rod 22. Thus, when a large proportion of the laser light is absorbed by the YAG rod 22, the filter plate 14 also absorbs the same large proportion of the laser light, so that only a small amount of light is transmitted therethrough to be received by the second photodetector 13. Conversely, when the wavelength of the laser light of the semiconductor laser device 11 deviates from the range of wavelengths of the light which can be absorbed at high efficiency by the YAG rod 22, the amount of light absorbed by the YAG rod 22 and accordingly by the filter plate 14 decreases, thereby increasing the amount of light to be received by the second photodetector 13.

The second comparator 34 receives signals output from the first and second photodetectors 12 and 13 as described above, and compares these output signals. When the second comparator 34 determines that the difference between the amount of light detected by the first photodetector 12 and that detected by the second photodetector 13 is equal to or less than a predetermined level, it outputs a predetermined signal to the temperature regulator 16. Upon receiving the predetermined signal, the temperature regulator 16 controls the temperature of the semiconductor laser device 11 so that laser light with an appropriate wavelength (i.e., 0.809 μm in this embodiment) is emitted therefrom.

Therefore, the semiconductor laser device 11 constantly emits laser light with a predetermined wavelength which can be efficiently absorbed by the YAG rod 22. This assures stable generation of a final laser beam at a high output level in the YAG rod 22.

In the above embodiment, the temperature regulator 16 comprising the Peltier element is used to adjust the wavelength of the laser light to be emitted from the semiconductor laser device 11. For the adjustment of the wavelength, however, other arrangements can be adopted. For example, a complex resonator-type semiconductor laser device may be used as the light source for optical pumping, in which the resonating mode is regulated to adjust the wavelength of the laser light to be emitted. Another arrangement can also be adopted in which a modulating signal is fed to the semiconductor laser device 11 and then a signal generated in the second photodetector 13 is subjected to phase-locked synchronous detection, thereby adjusting the wavelength of the laser light. In this case, the wavelength can be adjusted more accurately.

Figure 3:
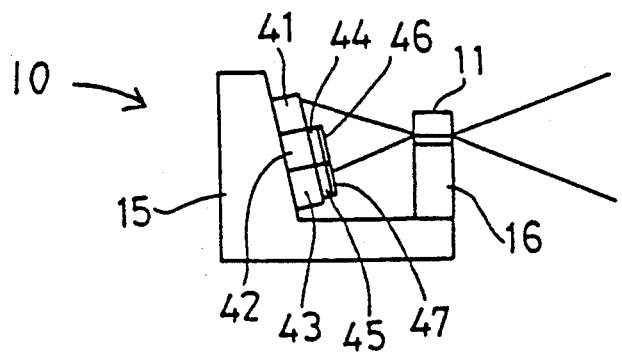
FIG. 3 is a schematic diagram showing another example of the semiconductor laser section of the optical pumping-type solid-state laser apparatus in accordance with the invention.

FIG. 3 shows another example of the semiconductor laser section 10, which includes a first photodetector 41 and a pair of second photodetectors 42 and 43 to receive and detect the laser light emitted from the rear side of the semiconductor laser device 11 disposed on the temperature regulator 16. The second photodetectors 42 and 43 are provided with filter plates 44 and 45, respectively. The surfaces of the filter plates 44 and 45 are coated with films 46 and 47, respectively, each of which transmits light with a different predetermined range of wavelengths. The central values of these ranges of wavelengths are slightly shifted from each other. The first photodetector 41 has no filter plate and accordingly receives the laser light directly. The temperature regulator 16 operates in accordance with the amounts of light detected by the first and second photodetectors 41, 42 and 43. This arrangement assures more accurate adjustment of the wavelength of the laser light to be emitted from the semiconductor laser device 11.

Figure 4:
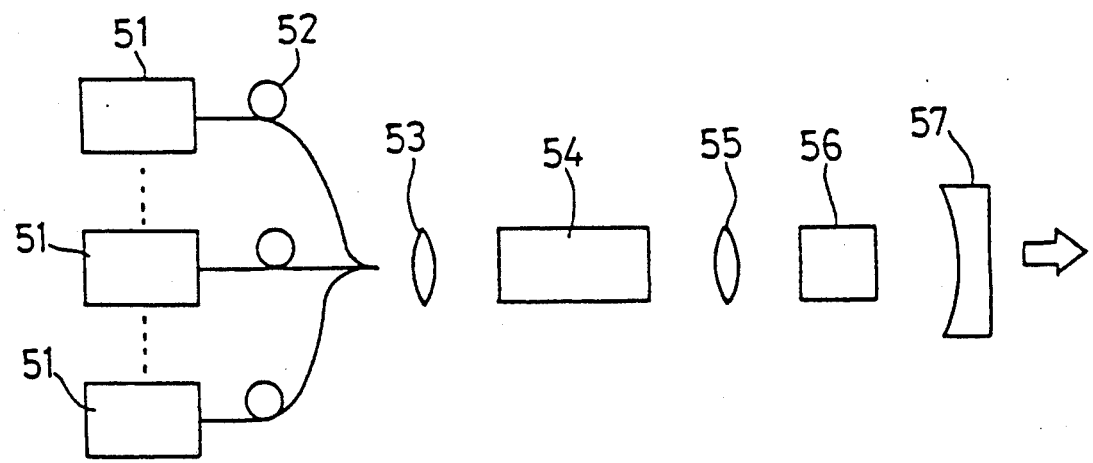
FIG. 4 is a schematic diagram showing another optical pumping-type solid-state laser apparatus of the invention.
Figure 5:
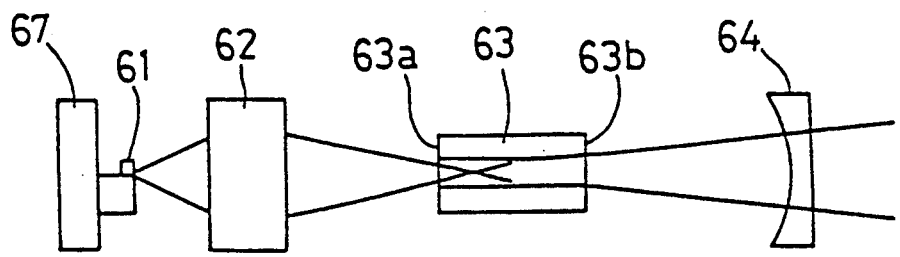
FIG. 5 is a schematic diagram showing a conventional optical pumping-type solid-state laser apparatus with a semiconductor laser device.

FIG. 4 shows another optical pumping-type solid-state laser apparatus of this invention, which comprises a plurality of semiconductor laser sections 51 with the same construction as that of the semiconductor laser section 10 shown in FIG. 1. Laser beams emitted from the respective semiconductor laser sections 51 are directed through optical fibers 52 into an optical system 53, which converges the laser beams into the light-receiving facet of the YAG rod 54. At the other side of the YAG rod 54 is disposed a lens 55 facing the light-emitting facet thereof. Further at the other side of the lens 55, a nonlinear optical crystal 56 and a reflecting mirror 57 are located in that order. On receiving the laser beams, the YAG rod 54 is optically pumped to generate a YAG laser beam, which is directed through the lens 55 into the nonlinear optical crystal 56 such as KTP or the like, where the second harmonic wave of the YAG laser beam is generated due to the nonlinear optical effect, resulting in a green laser beam.

In the above embodiments, the semiconductor laser device is so located as to direct its laser light to one of the facets of the YAG rod, but the invention is not limited to this arrangement. For example, the semiconductor laser device can be so located to direct its laser light to the longitudinal side of the YAG rod. Furthermore, the solid-state laser is not limited to the YAG laser, but other solid-state lasers such as YLF, YVO₄, YSGG lasers, and the like, are applicable. The YAG laser which generates light with wavelengths other than that of 1.064 μm can also be used.

Figure 6A:
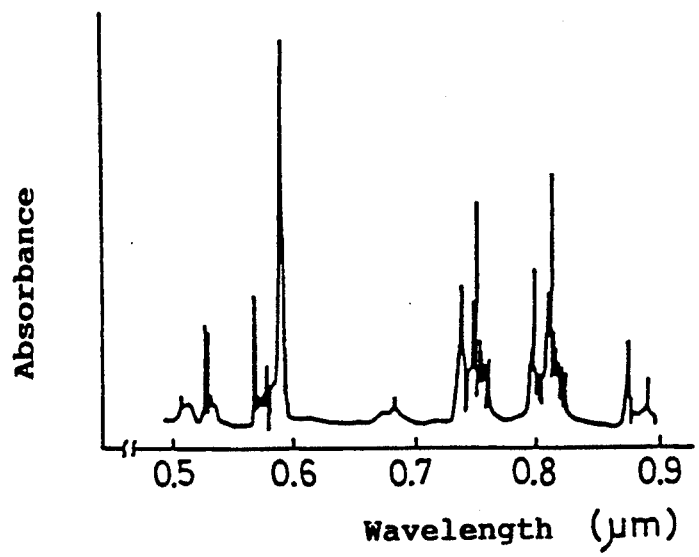
FIG. 6A is a graph showing light-absorption characteristics of a YAG laser with respect to the wavelengths of light.
Figure 6B:
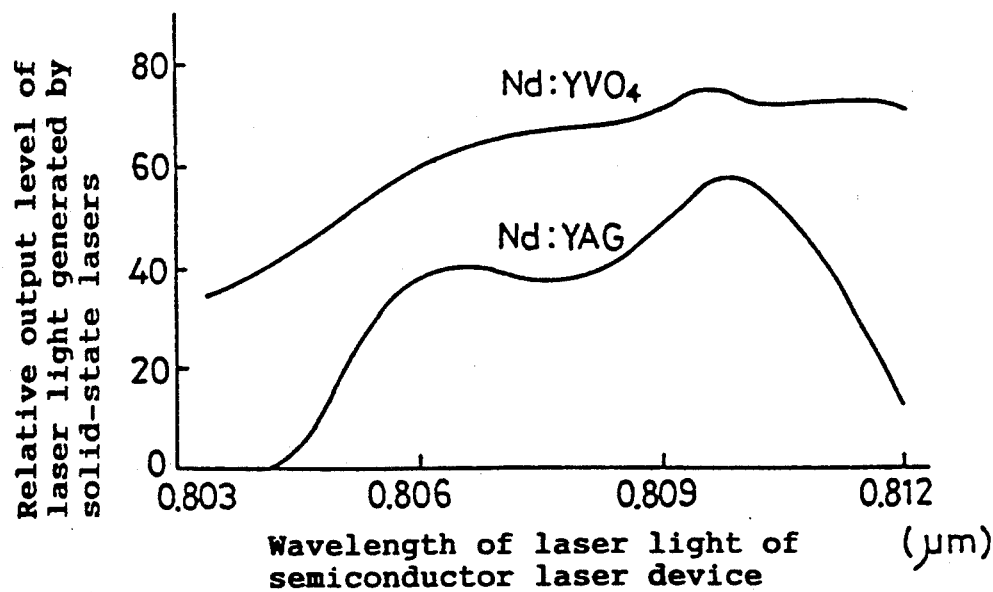
FIG. 6B is a graph showing the relationship between the wavelength of the laser light absorbed by solid-state lasers and the level of the laser light output therefrom.

The Nd-doped YAG rod 22 of the solid-state laser apparatus shown in FIG. 1 can be replaced with an Nd-doped YVO₄ rod, and the filter plate 14 made of the same material as that of the Nd-doped YAG rod can be disposed on the light-receiving facet of the photodetector 13. In this case, as shown in FIG. 6B, the spectrum of wavelengths of light efficiently absorbed by the Nd-doped YAG rod is smaller than that of light efficiently absorbed by the Nd-doped YVO₄ rod. Thus, the range of wavelengths of the light to be emitted from the semiconductor laser device 11 is regulated to be smaller than that of the wavelengths of the light to be efficiently absorbed by the YVO₄ rod. This assures more accurate adjustment of the wavelength of the laser light for optical pumping.

In general, part of the laser beam emitted from the semiconductor laser device is often returned thereto, and the returned light tends to change the wavelength of the subsequent laser beams emitted from the semiconductor laser device. In order to reduce the influence of this returned light, the semiconductor laser device of the solid-state laser apparatus of this invention can be driven at high frequency of 100-600 MHz so as to slightly widen the spectral width thereof, thereby reducing the coherence length. With the reduced coherence length, the wavelength of the laser beam is not affected by the returned light.

As described above, in the optical pumping-type solid-state laser apparatus of this invention, the wavelength of the laser beam to be emitted from the semiconductor laser device for optical pumping is accurately adjusted to be the same as that of the light to be efficiently absorbed by the solid-state laser. Thus, the solid-state laser can stably output a laser beam at a high output level.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. An optical pumping-type solid-state laser apparatus comprising:
   a semiconductor laser device for emitting light from two opposite sides;
   a solid-state laser which is optically pumped by laser light with a predetermined pumping wavelength emitted from a first side of said semiconductor laser device and absorbed by the solid-state laser to as to generate laser light with a target wavelength;
   a first optical detection means for detecting the amount of laser light emitted from a second side of said semiconductor laser device;
   a second optical detection means for detecting the amount of laser light which has been emitted from said second side of said semiconductor laser device and transmitted through a filter means, said filter means selectively absorbing light with the same said pumping wavelength as that of light to be absorbed by said solid-state laser; and
   a means for modifying the wavelength of the laser light to be emitted from said first side of the semiconductor laser device in accordance with difference between the amounts of laser light detected by said first and second optical detection means.

2. An apparatus according to claim 1, wherein said means for modifying the wavelength of the laser light is a temperature regulator which regulates the temperature regulator which regulates the temperature of said semiconductor laser device.

3. An apparatus according to claim 1, wherein said second optical detection means includes a photodetector.

4. An apparatus according to claim 1, wherein said second optical detection means includes two photodetectors for detecting the amount of laser light which has been emitted from said second side of said semiconductor laser device and transmitted through two respective filter means, said two filter means being arranged to first transmit laser light with two different ranges of wavelengths, respectively, and then absorb light with the save wavelength as that of the light to be absorbed by said solid-state laser, the central value of said two ranges of wavelengths being slightly shifted from each other.

5. An apparatus to claim 1, wherein said solid-state laser receives laser beams emitted from said first side of a plurality of semiconductor laser devices.

6. An apparatus according to claim 1, wherein said solid-state laser is a YAG laser.

7. A laser system comprising:
   a solid-state laser including a predetermined material which selectively absorbs a predetermined pumping wavelength of electromagnetic radiation; and
   an electrically driven semiconductor laser disposed to generate and direct electromagnetic radiation into the material of said solid-state laser;
   a wavelength detector including at least one filter having at least one component including some of said predetermined material, said wavelength detector being disposed to monitor electromagnetic radiation output from said semiconductor laser and, in response, to produce a detector electrical output dependent upon the deviation of the semiconductor laser radiation output wavelength from said predetermined pumping wavelength; and
   wavelength control apparatus connected to receive the detector electrical output and, in response, to controllably maintain the semiconductor laser output wavelength substantially at said predetermined pumping wavelength.

8. A laser system as in claim 7 wherein said wavelength detector comprises:
   a first photodectector disposed to directly receive electromagnetic radiation from said semiconductor laser and to produce a corresponding first electrical output;
   a second photodetector disposed to receive electromagnetic radiation from said semiconductor laser after passage through said filter to produce a second electrical output;
   a comparator connected to receive said first and second electrical signals and to produce a comparator output related to the difference therebetween.

9. A laser system as in claim 7 wherein said wavelength control apparatus comprises a temperature control device thermally coupled to said semiconductor laser and capable of controllably raising and lowering its operating temperature and thereby its output wavelength in response to the detector electrical output.

10. A laser system as in claim 8 further comprising:
a second comparator disposed to produce an output related to the difference between said first electrical signal and a standard signal; and
a driver circuit connected to electrically drive the semiconductor laser as a function of the second comparator output.

11. A laser system as in claim 8 wherein said second photodetector comprises a pair of photodetectors, each having wavelength selective transmission films superimposed with said filter, each of which films transmits radiation with differing central ranges of wavelengths.

12. A laser system as in claim 7 comprising a plurality of said semiconductor lasers, each having its associated said wavelength detector and said control apparatus, wherein electromagnetic radiation from each of said semiconductor lasers is directed via parallel optical fiber transmission lines onto said solid-state laser.

* * * * *